United States Patent
Kwon et al.

(10) Patent No.: US 9,270,255 B2
(45) Date of Patent: Feb. 23, 2016

(54) HIGH VOLTAGE DRIVER USING LOW VOLTAGE TRANSISTOR

(71) Applicant: SAMSUNG ELECTRO-MECHANICS CO., LTD., Suwon-Si, Gyeonggi-Do (KR)

(72) Inventors: Yong Il Kwon, Suwon-Si (KR); Moon Suk Jeong, Suwon-Si (KR); Tah Joon Park, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 92 days.

(21) Appl. No.: 14/305,804

(22) Filed: Jun. 16, 2014

(65) Prior Publication Data

US 2015/0229297 A1    Aug. 13, 2015

(30) Foreign Application Priority Data

Feb. 7, 2014    (KR) .......................... 10-2014-0013986

(51) Int. Cl.
*H03K 3/00*    (2006.01)
*H03K 3/012*    (2006.01)
*H03K 17/687*    (2006.01)

(52) U.S. Cl.
CPC .............. *H03K 3/012* (2013.01); *H03K 17/687* (2013.01)

(58) Field of Classification Search
CPC ....................................................... H03K 3/012
USPC ........................................................ 327/108
See application file for complete search history.

(56) References Cited

U.S. PATENT DOCUMENTS

| | | | | |
|---|---|---|---|---|
| 5,939,932 A * | 8/1999 | Lee | ...................... | H03K 17/102 326/121 |
| 6,040,708 A * | 3/2000 | Blake | ............... | H03K 3/356113 326/33 |
| 8,098,088 B1 * | 1/2012 | Sutandi | ............... | H03K 17/102 327/108 |
| 2006/0044015 A1 * | 3/2006 | Lee | ...................... | H03K 17/102 326/81 |
| 2012/0091985 A1 * | 4/2012 | Nierop | ............... | H03K 17/6874 323/311 |
| 2012/0092043 A1 * | 4/2012 | Nierop | ............... | H03K 17/6874 327/109 |
| 2013/0002149 A1 * | 1/2013 | Mott | ..................... | H02M 1/088 315/161 |
| 2014/0300413 A1 * | 10/2014 | Hoyerby | ................. | H02M 1/08 330/251 |

FOREIGN PATENT DOCUMENTS

KR    2004-0084523 A    10/2004

* cited by examiner

*Primary Examiner* — Ryan Jager
(74) *Attorney, Agent, or Firm* — NSIP Law

(57) ABSTRACT

A high voltage driver may include: a low side switching unit including first to n-th N-channel metal oxide semiconductor (NMOS) transistors; a high side switching unit including first and second to n-th P-channel MOS (PMOS) transistors; a voltage dividing unit dividing a voltage between the output terminal and the ground; a first constant voltage unit providing a constant voltage and a unidirectional signal path between a source and a gate of each of the first to n-th NMOS transistors; a second constant voltage unit providing a constant voltage and a unidirectional signal path between a source and a gate of each of the first to n-th PMOS transistors; a first charging unit providing a charged voltage to each of the gates of the second to n-th NMOS transistors; and a second charging unit providing a charged voltage to each of the gates of the second to n-th PMOS transistors.

20 Claims, 11 Drawing Sheets

HIGH VOLTAGE DRIVER USING LOW VOLTAGE TRANSISTOR

CROSS-REFERENCE TO RELATED APPLICATION

This application claims the benefit of Korean Patent Application No. 10-2014-0013986 filed on Feb. 7, 2014, with the Korean Intellectual Property Office, the disclosure of which is incorporated herein by reference.

BACKGROUND

The present disclosure relates to a high voltage driver using a low voltage transistor.

Generally, as a charge pump generating a high voltage from a low voltage, several common types of charge pump are available. Examples of such charge pumps include a floating well charge pump, a body-controlled charged pump, a 4-phase charge pump, a voltage doubler charge pump, and the like. Among these, the voltage doubler charge pump may be the best in terms of efficiency, such that it is commonly used.

In order to change the level of a low voltage into a high voltage as described above, the charge pump may be used. In this case, in order to generate a driving signal having a high level and a low level using the generated high voltage, a transistor, a switching device for generating a basic driving signal, should be designed so as to endure the high voltage.

However, when a transistor having a high breakdown voltage is not provided in a process, even in the case that a high voltage is generated, it is difficult to generate the driving signal using the high voltage.

Meanwhile, the following Related Art Document (Patent Document 1) relates to a high voltage driver using a medium voltage device, a high voltage driver according to the related art. However, Patent Document 1 does not disclose a technical feature of generating a high voltage driving signal using a low voltage transistor, individually grounded charging capacitors, and two control signals.

RELATED ART DOCUMENT (Patent Document 1) US Patent Application Publication No. 2013-0002149

SUMMARY

An aspect of the present disclosure may provide a high voltage driver using a low voltage transistor capable of generating a high voltage driving signal using the low voltage transistor, individually grounded charging capacitors, and two control signals.

According to an aspect of the present disclosure, a high voltage driver may include: a low side switching unit including first and second to n-th N-channel metal oxide semiconductor (NMOS) transistors connected to each other in series between an output terminal and a ground and operated in a turned-on or turned-off state depending on a first control signal; a high side switching unit including first and second to n-th P-channel MOS (PMOS) transistors connected to each other in series between a power supply voltage terminal and the output terminal and operated complementarily to the low side switching unit depending on a second control signal; a voltage dividing unit dividing a voltage between the output terminal and the ground and providing the divided voltages to connection nodes between the first and second to n-th PMOS transistors and connection nodes between the first and second to n-th NMOS transistors, respectively; a first constant voltage unit providing a constant voltage and a unidirectional signal path between a source and a gate of each of the first and second to n-th NMOS transistors; a second constant voltage unit providing a constant voltage and a unidirectional signal path between a source and a gate of each of the first and second to n-th PMOS transistors; a first charging unit charged with a voltage through the signal path of the first constant voltage unit and providing the charged voltage to each of the gates of the second to n-th NMOS transistors; and a second charging unit charged with a voltage through the signal path of the second constant voltage unit and providing the charged voltage to each of the gates of the second to n-th PMOS transistors.

According to another aspect of the present disclosure, a high voltage driver may include: a control signal generating unit generating a first control signal having a high level and a low level based on a ground level and a second control signal having an opposite phase to that of the first control signal and having a high level and a low level based on a power supply voltage; a low side switching unit including first and second to n-th NMOS transistors connected to each other in series between an output terminal and a ground and operated in a turned-on or turned-off state depending on the first control signal; a high side switching unit including first and second to n-th PMOS transistors connected to each other in series between a power supply voltage terminal and the output terminal and operated in a turn-off or turn-on state depending on the second control signal; a voltage dividing unit dividing a voltage between the output terminal and the ground and providing the divided voltages to connection nodes between the first and second to n-th PMOS transistors and connection nodes between the first and second to n-th NMOS transistors, respectively; a second constant voltage unit providing a constant voltage and a unidirectional signal path between a source and a gate of each of the first and second to n-th PMOS transistors; a first constant voltage unit providing a constant voltage and a unidirectional signal path between a source and a gate of each of the first and second to n-th NMOS transistors; a second charging unit charged with a voltage through the signal path of the second constant voltage unit and providing the charged voltage to each of the gates of the second to n-th PMOS transistors; and a first charging unit charged with a voltage through the signal path of the first constant voltage unit and providing the charged voltage to each of the gates of the second to n-th NMOS transistors.

According to another aspect of the present disclosure, a high voltage driver may include: a control signal generating unit generating a first control signal having a high level and a low level based on a ground level and a second control signal having an opposite phase to that of the first control signal and having a high level and a low level based on a power supply voltage; a low side switching unit including first and second to n-th NMOS transistors connected to each other in series between an output terminal and a ground and operated in a turned-on or turned-off state depending on the first control signal; a high side switching unit including first and second to n-th PMOS transistors connected to each other in series between a power supply voltage terminal and the output terminal and operated in a turn-off or turn-on state depending on the second control signal; a voltage dividing unit dividing a voltage between the output terminal and the ground and providing the divided voltages to connection nodes between the first and second to n-th PMOS transistors and connection nodes between the first and second to n-th NMOS transistors, respectively; a second constant voltage unit providing a constant voltage and a unidirectional signal path between a source and a gate of each of the first and second to n-th PMOS transistors; a first constant voltage unit providing a constant voltage and a unidirectional signal path between a source and a gate of each of the first and second to n-th NMOS transistors; a second charging unit charged with a voltage through the signal path of the second constant voltage unit and providing the charged voltage to each of the gates of the second to n-th PMOS transistors; a first charging unit charged with a voltage through the signal path of the first constant voltage unit and providing the charged voltage to each of the gates of the second to n-th NMOS transistors; and a signal synchronizing unit connected between terminals of the control signal generating unit outputting the first and second control signal.

The first NMOS transistor may be operated in the turned-on or turned-off state depending on the first control signal, and the second to n-th NMOS transistors may be operated in synchronization with an operational state of the first NMOS transistor.

The first PMOS transistor may be operated in the turned-on or turned-off state depending on the second control signal, and the second to n-th PMOS transistors may be operated in synchronization with an operational state of the first PMOS transistor.

The voltage dividing unit may include first to n-th resistors connected to each other in series between the output terminal and the ground and having the same resistance value in order to uniformly divide the voltage.

The first constant voltage unit may include a plurality of diodes connected between the sources and the gates of the second to n-th NMOS transistors, respectively, in a forward direction.

The second constant voltage unit may include a plurality of diodes connected between the sources and the gates of the second to n-th PMOS transistors, respectively, in a forward direction.

The first charging unit may include a plurality of capacitors connected between the gates of the second to n-th NMOS transistors and the ground, respectively, and providing the charged voltage.

The second charging unit may include a plurality of capacitors connected between the gates of the second to n-th PMOS transistors and the ground, respectively, and providing the charged voltage.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
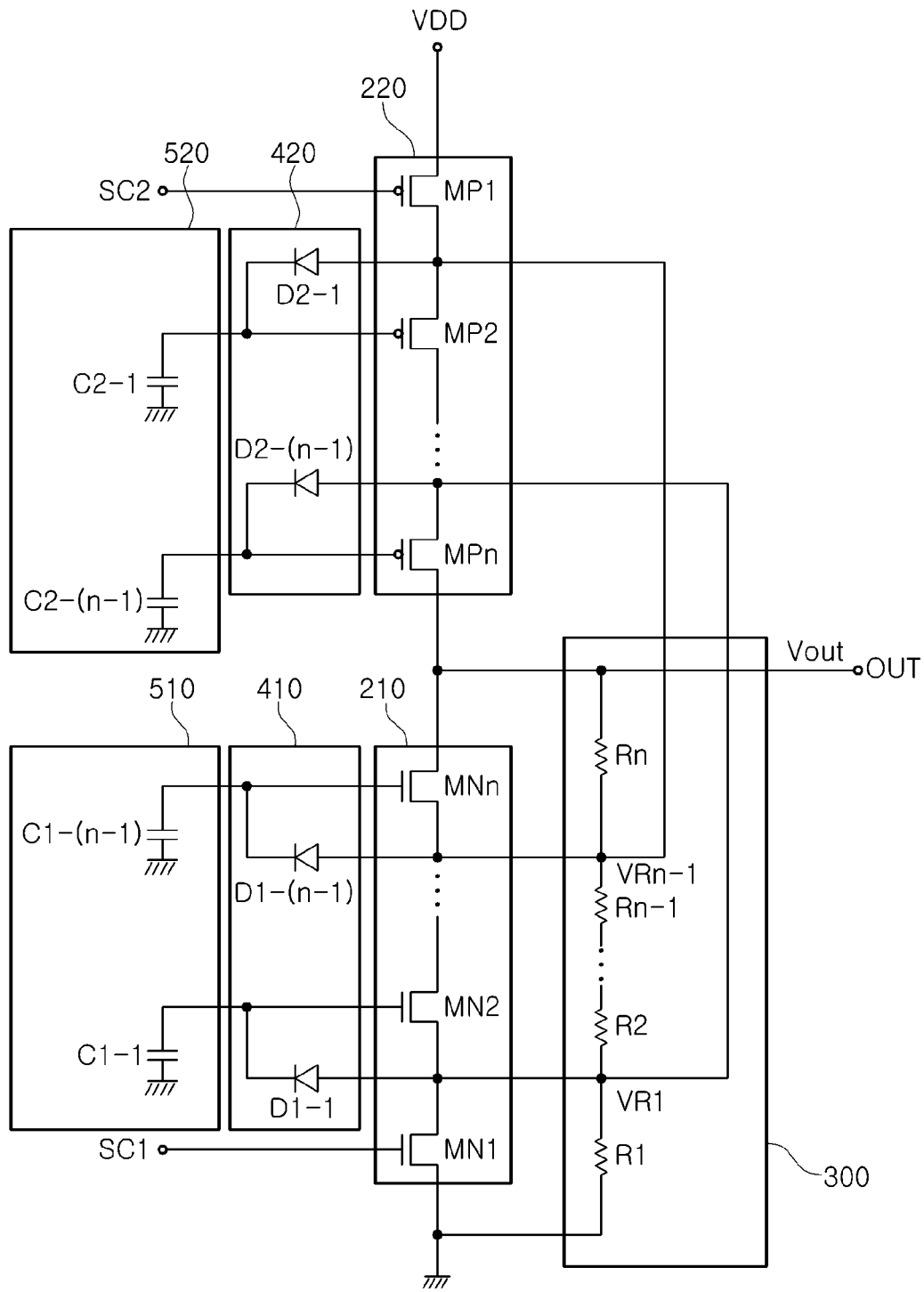
FIG. 1 is a block diagram of a high voltage driver according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

Figure 2:
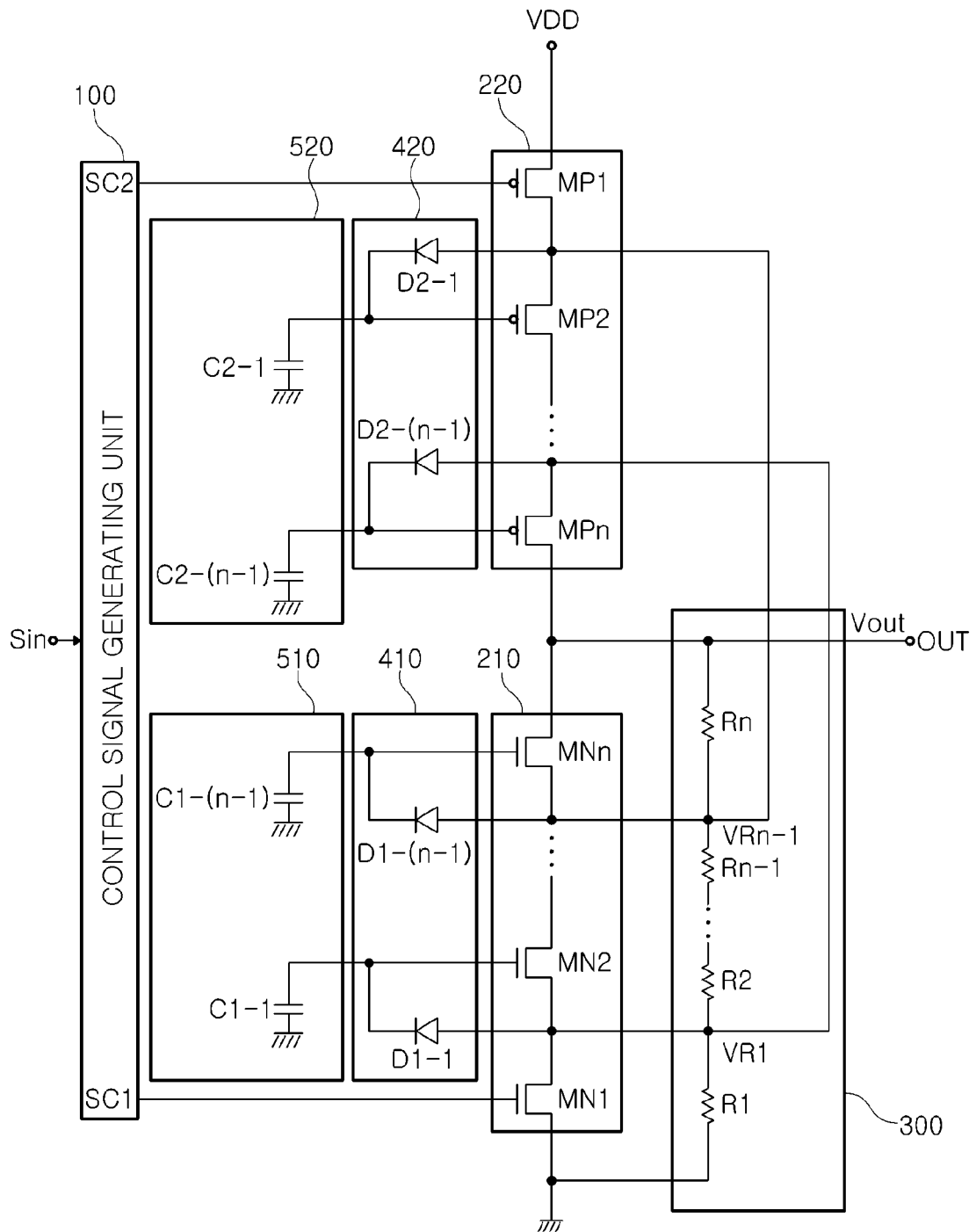
FIG. 2 is another block diagram of a high voltage driver according to an exemplary embodiment of the present disclosure.

FIG. 1 is a block diagram of a high voltage driver according to an exemplary embodiment of the present disclosure; FIG. 2 is another block diagram of a high voltage driver according to an exemplary embodiment of the present disclosure; and FIG. 3 is another block diagram of a high voltage driver according to an exemplary embodiment of the present disclosure.

Referring to FIG. 1, a high voltage driver according to an exemplary embodiment of the present disclosure may include a low side switching unit 210, a high side switching unit 220, a voltage dividing unit 300, a first constant voltage unit 410, a second constant voltage unit 420, a first charging unit 510, and a second charging unit 520.

Referring to FIG. 2, a high voltage driver according to an exemplary embodiment of the present disclosure may include a control signal generating unit 100, a low side switching unit 210, a high side switching unit 220, a voltage dividing unit 300, a first constant voltage unit 410, a second constant voltage unit 420, a first charging unit 510, and a second charging unit 520.

Figure 3:
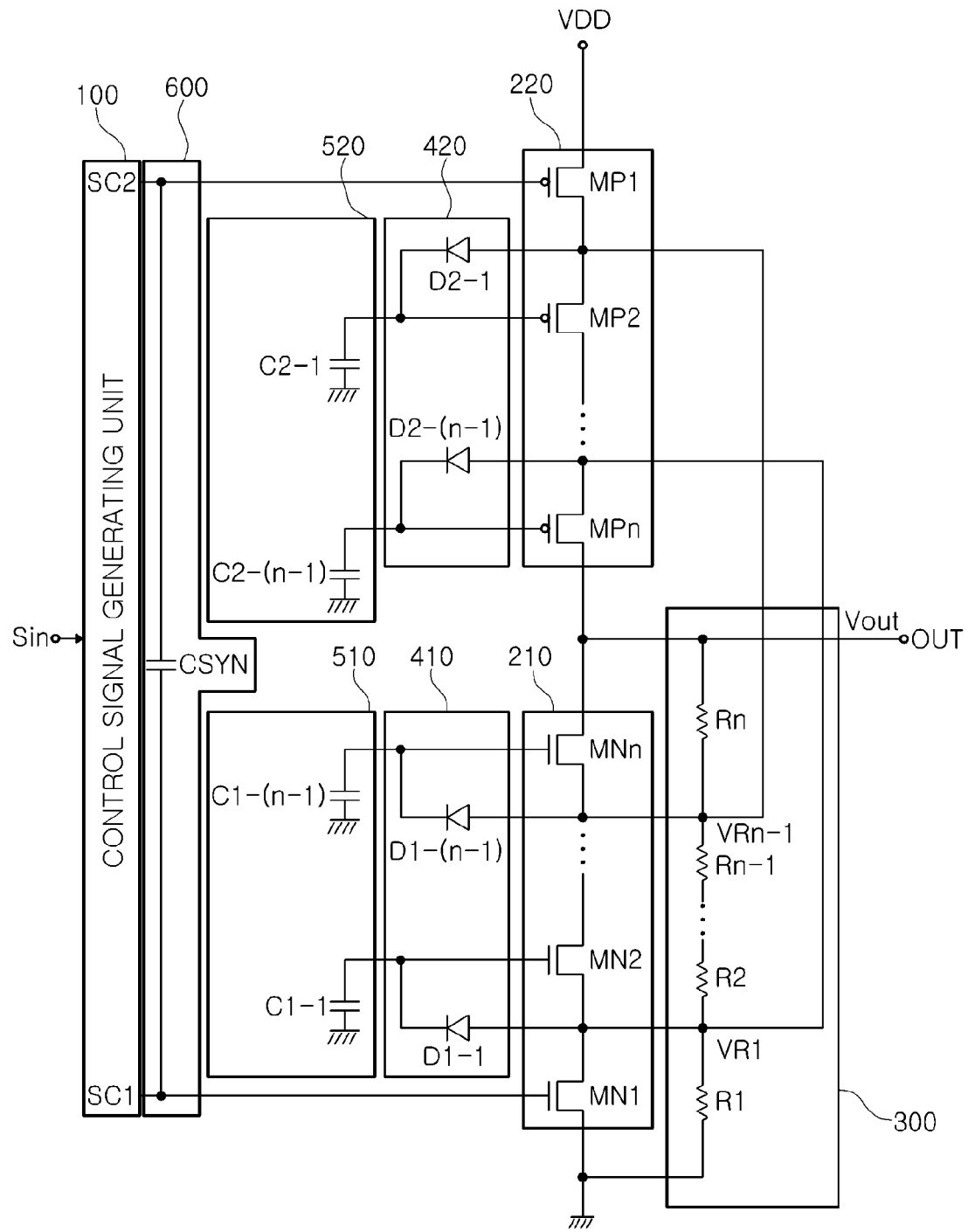
FIG. 3 is another block diagram of a high voltage driver according to an exemplary embodiment of the present disclosure.

Referring to FIG. 3, a high voltage driver according to an exemplary embodiment of the present disclosure may include a control signal generating unit 100, a low side switching unit 210, a high side switching unit 220, a voltage dividing unit 300, a first constant voltage unit 410, a second constant voltage unit 420, a first charging unit 510, and a second charging unit 520.

The high voltage driver may further include a signal synchronizing unit 600. Meanwhile, in the case in which the control signal generating unit 100 includes a signal synchronizing unit at an inner side thereof, the control signal generating unit 100 does not need to include a separate signal synchronizing unit 600 at an outer side thereof.

Referring to FIGS. 2 and 3, the control signal generating unit 100 may generate a first control signal SC1 having a high level and a low level based on a ground level and a second control signal SC2 having an opposite phase to that of the first control signal SC1 and having a high level and a low level based on a power supply voltage VDD.

Referring to FIG. 3, the signal synchronizing unit 600 may be connected between terminals of the control signal generating unit 100 outputting the first and second control signals SC1 and SC2, respectively, and may synchronize the first and second control signals SC1 and SC2 with each other.

As an example, the signal synchronizing unit 600 may include one synchronization capacitor CSYN connected between an output terminal of the first control signal SC1 and an output terminal of the second control signal SC2. Since a voltage of the output terminal of the first control signal SC1 and a voltage of the output terminal of the second control signal SC2 are affected by each other by the synchronization capacitor CSYN, the synchronization capacitor CSYN may accurately correct synchronization between the low level and the high level of each of the first and second control signals SC1 and SC2.

Referring to FIGS. 1 through 3, the low side switching unit 210 may include first and second to n-th N-channel metal oxide semiconductor (NMOS) transistors MN1 and MN2 to MNn connected to each other in series between an output terminal OUT and a ground and may be operated in a turned-on or turned-off state depending on the first control signal SC1.

As an example, the first NMOS transistor MN1 may be operated in the turned-on or turned-off state depending on the first control signal SC1, and the second to n-th NMOS transistors MN2 to MNn may be operated in synchronization with an operational state of the first NMOS transistor MN1.

The high side switching unit 220 may include first and second to n-th P-channel MOS (PMOS) transistors MP1 and MP2 to MPn connected to each other in series between a power supply voltage VDD terminal and the output terminal OUT and may be operated complementarily to the low side switching unit 210 depending on the second control signal SC2. That is, when the low side switching unit 210 is in a turn-on state, the high side switching unit 220 may be operated in a turn-off, and when the low side switching unit 210 is in a turn-off state, the high side switching unit 220 may be operated in a turn-on state.

As an example, the first PMOS transistor MP1 may be operated in the turned-on or turned-off state depending on the second control signal SC2, and the second to n-th PMOS transistors MP2 to MPn may be operated in synchronization with an operational state of the first PMOS transistor MP1.

The voltage dividing unit 300 may divide a voltage between the output terminal OUT and the ground and provide the divided voltages to connection nodes between the first and second to n-th PMOS transistors MP1 and MP2 to MPn and connection nodes between the first and second to n-th NMOS transistors MN1 and MN2 to MNn, respectively.

As an example, the voltage dividing unit 300 may include first to n-th resistors connected to each other in series between the output terminal OUT and the ground, wherein the first to n-th resistors may have the same resistance value in order to uniformly divide the voltage.

The first constant voltage unit 420 may provide a constant voltage and a unidirectional signal path between a source and a gate of each of the first and second to n-th NMOS transistors MN1 and MN2 to MNn.

As an example, the first constant voltage unit 410 may include a plurality of diodes D1-1 to D1-(n−1) connected between the sources and the gates of the second to n-th NMOS transistors MN2 to MNn, respectively, in a forward direction.

The second constant voltage unit 420 may provide a constant voltage and a unidirectional signal path between a source and a gate of each of the first and second to n-th PMOS transistors MP1 and MP2 to MPn.

As an example, the second constant voltage unit 420 may include a plurality of diodes D2-1 to D2-(n−1) connected between the sources and the gates of the second to n-th PMOS transistors MP2 to MPn, respectively, in a forward direction.

The first charging unit 510 may be charged with a voltage through the signal path of the first constant voltage unit 410 and may provide the charged voltage to each of the gates of the second to n-th NMOS transistors MN2 to MNn.

As an example, the first charging unit 510 may include a plurality of capacitors C1-1 to C1-(n−1) connected between the gates of the second to n-th NMOS transistors MN2 to MNn and the ground, respectively, and providing the charged voltage.

The second charging unit 520 may be charged with a voltage through the signal path of the second constant voltage unit 420 and may provide the charged voltage to each of the gates of the second to n-th PMOS transistors MP2 to MPn.

As an example, the second charging unit 520 may include a plurality of capacitors C2-1 to C2-(n−1) connected between the gates of the second to n-th PMOS transistors MP2 to MPn and the ground, respectively, and providing the charged voltage.

Figure 4:
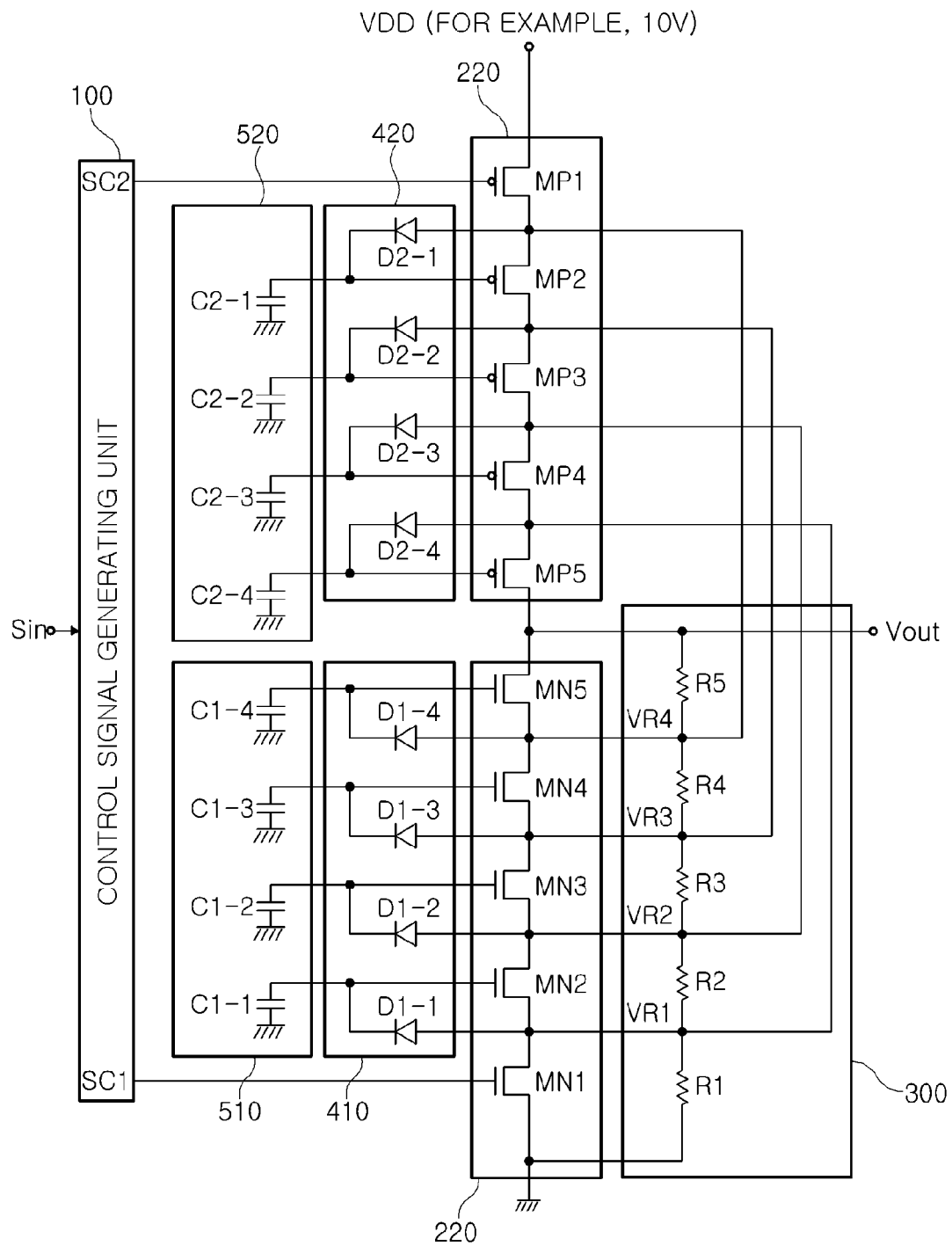
FIG. 4 is a circuit diagram of the high voltage driver according to an exemplary embodiment of the present disclosure.

FIG. 4, a circuit diagram of the high voltage driver according to an exemplary embodiment of the present disclosure, shows the case in which the low side switching unit 210 includes first to fifth NMOS transistors MN1 to MN5 and the high side switching unit 220 includes first and fifth PMOS transistors MP1 to MP5.

Therefore, the voltage dividing unit 300 may include first and fifth resistors R1 to R5, the first constant voltage unit 410 may include four diodes D1-1 to D1-4, and the second constant voltage unit 420 may also include four diodes D2-1 to D2-4.

In addition, the first charging unit 510 may include four capacitors C1-1 to C1-4, and the second charging unit 520 may include four capacitors C2-1 to C2-4.

Meanwhile, the voltage dividing unit 300 may divide the voltage between the output terminal OUT and the ground and provide the divided voltages to connection nodes between the first to fifth PMOS transistors MP1 to MP5 and connection nodes between the first to fifth NMOS transistors MN1 to MN5, respectively.

As an example, the voltage dividing unit 300 may include first to fifth resistors R1 to R5 connected to each other in series between the output terminal OUT and the ground, wherein the first to fifth resistors R1 to R5 may have the same resistance value in order to uniformly divide the voltage.

In detail, in the case in which an output voltage Vout of the output terminal OUT is 10V, the output voltage Vout of 10V may be divided into 8V (VR4), 6V (VR3), 4V (VR2), and 2V (VR1) by the first and fifth resistors R1 to R5 of the voltage dividing unit 300, respectively.

Hereinafter, an operation of the high voltage driver according to an exemplary embodiment of the present disclosure will be described with reference to FIGS. 5 through 11 based on FIG. 4.

Figure 5:
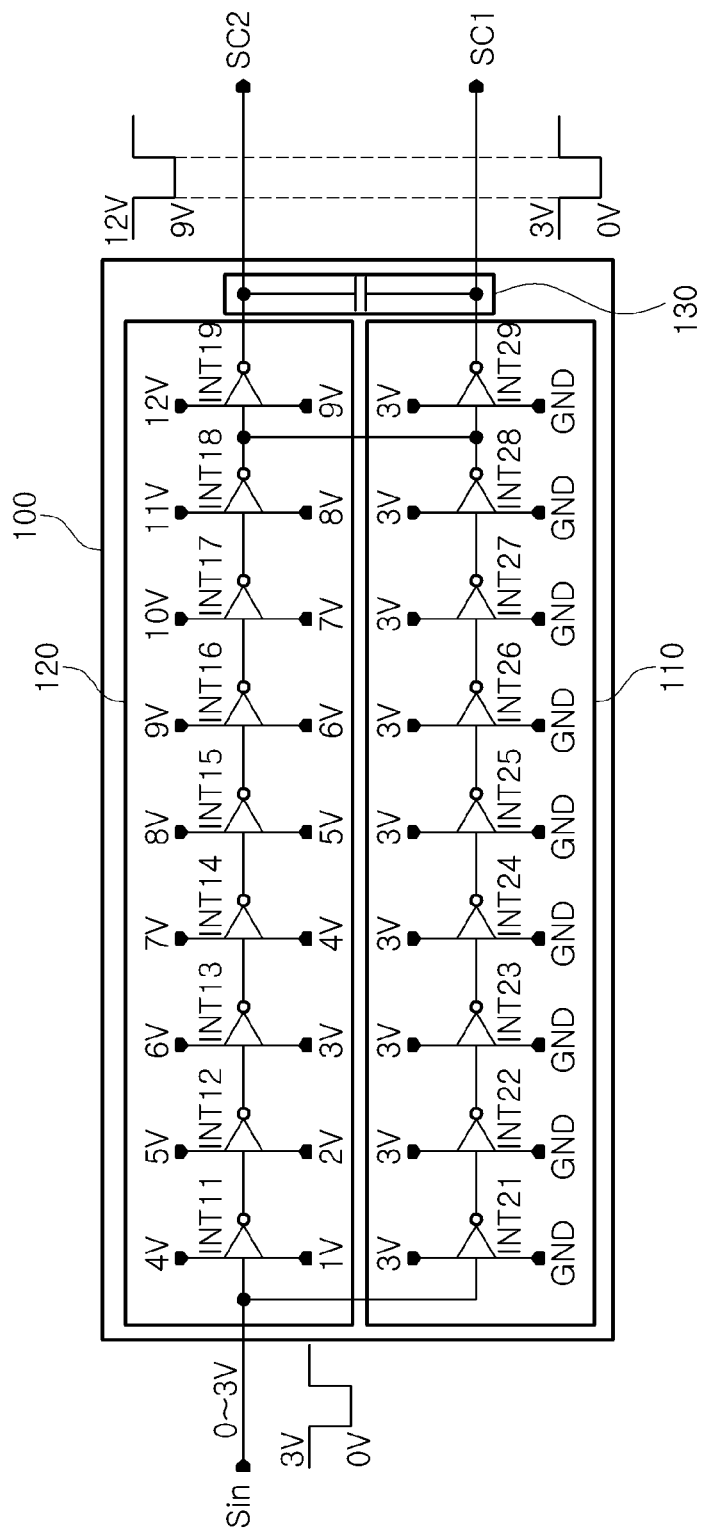
FIG. 5 is a circuit diagram of a control signal generating unit according to an exemplary embodiment of the present disclosure.

FIG. 5 is a circuit diagram of a control signal generating unit according to an exemplary embodiment of the present disclosure.

Referring to FIG. 5, the control signal generating unit 100 may include a first control signal generating unit 110 generating the first control signal SC1 and a second control signal generating unit 120 generating the second control signal SC2.

In addition, the control signal generating unit 100 does not separately include the signal synchronizing unit 600 at an outer side thereof as shown in FIG. 4, the control signal generating unit 100 may include a signal synchronizing unit 130 at an outer side of an inner portion thereof.

Here, since the signal synchronizing unit 130 performs the same function as that of the signal synchronizing unit 600 described above, a description thereof will be omitted.

The first control signal generating unit 110 may generate the first control signal SC1 using an input signal Sin through first to ninth inverters INT11 to INT19. Here, the first control signal SC1 may have a low level of 0V and a high level of 3V like the input signal Sin.

The second control signal generating unit 120 may generate the second control signal SC2 using the input signal Sin through first to ninth inverters INT21 to INT29.

As an example, the second control signal SC2 may be generated through the first to ninth inverters INT21 to INT29, more specifically, the first inverter INT21 having a low level of 1V and a high level of 4V, the second to eighth inverters having low and high levels sequentially increased from the low level and the high level of the first inverter INT21 by 1V, respectively, and the ninth inverter INT29 having a low level of 9V and a high level of 12V.

Here, the number of inverters included in the first control signal generating unit 110 may be the same as that of inverters included in the second control signal generating unit 120 in order to allow delay times of the first and second control signal generating units 110 and 120 to be the same as each other.

Figure 6:
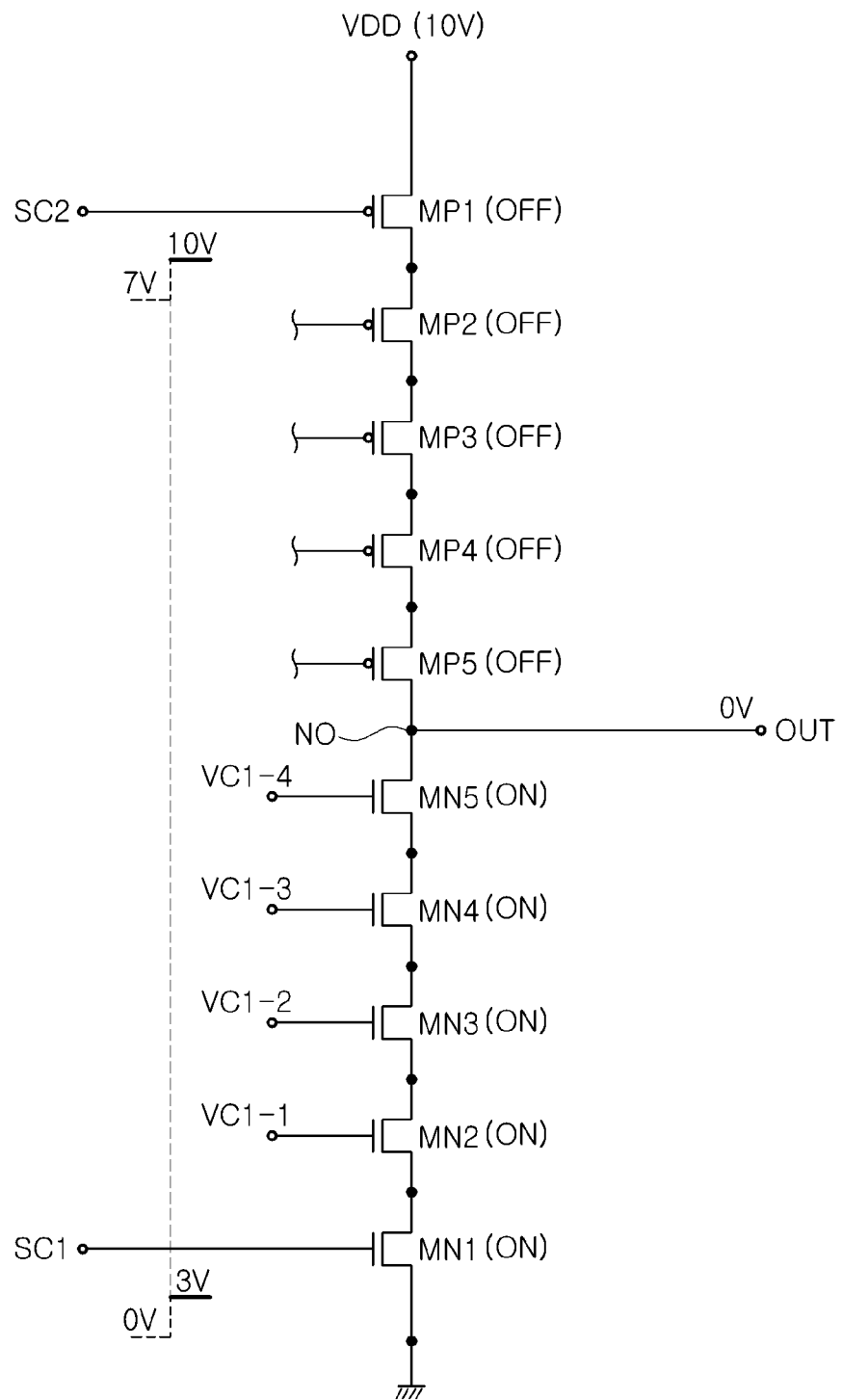
FIG. 6 is a diagram illustrating a first operation of the high voltage driver according to an exemplary embodiment of the present disclosure.
Figure 7:
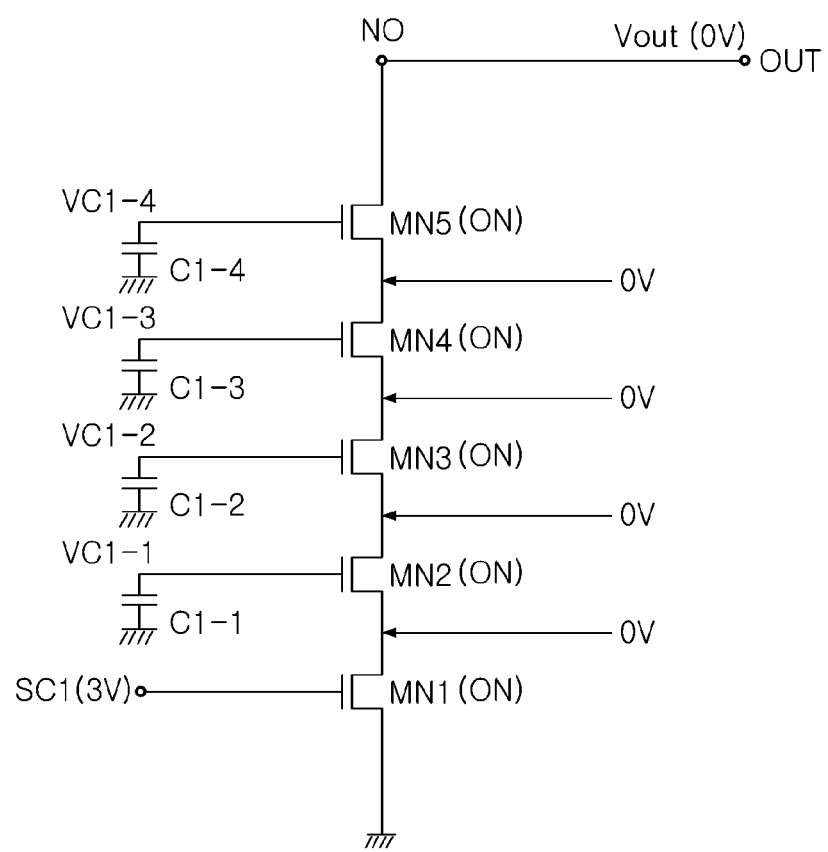
FIG. 7 is a diagram illustrating an operation of a low side switching unit of FIG. 6.
Figure 8:
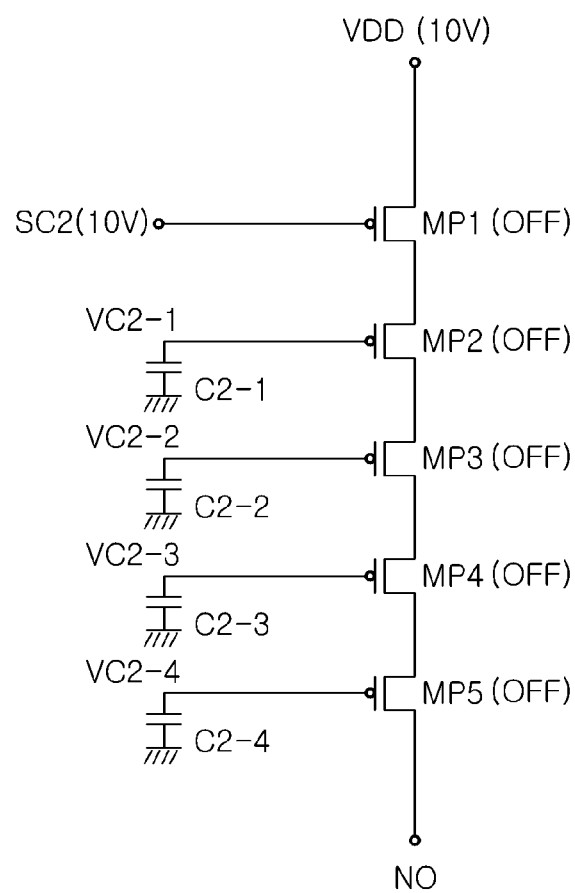
FIG. 8 is a diagram illustrating an operation of a high side switching unit of FIG. 6.

FIG. 6 is a diagram illustrating a first operation of the high voltage driver according to an exemplary embodiment of the present disclosure; FIG. 7 is a diagram illustrating an operation of a low side switching unit of FIG. 6; and FIG. 8 is a diagram illustrating an operation of a high side switching unit of FIG. 6.

First, referring to FIG. 6, when it is assumed that the operating voltage VDD is 10V and the ground is 0V, in the case in which the first control signal SC1 is the high level 3V and the second control signal SC2 is 10V, all of the first to fifth NMOS transistors MN1 to MN5 of the low side switching unit 210 may be turned on by the first control signal SC1 of 3V, and all of the first to fifth PMOS transistors MP1 to MP5 of the high side switching unit 220 may be turned off by the second control signal SC2 of 10V.

Therefore, the output terminal OUT of the high voltage driver may be connected to the ground through the low side switching unit 210 that is in the turn-on state, such that the output voltage Vout may become 0V.

Referring to FIG. 7, in the case in which the first control signal SC1 is the high level (3V), the first NMOS transistor MN1 of the low side switching unit 210 may be first turned on.

A source of the second NMOS transistor MN2 of the low side switching unit 210 may be connected to the ground through the first NMOS transistor MN1 that is in the turn-on state, and a voltage charged in the capacitor C1-1 of the first charging unit may be provided to a gate of the second NMOS transistor MN2. Therefore, in the case in which the voltage charged in the capacitor C1-1 of the first charging unit is a conduction voltage or more, the second NMOS transistor MN2 may be turned on.

A source of the third NMOS transistor MN3 of the low side switching unit 210 may be connected to the ground through the first and second NMOS transistors MN1 and MN2 that are in the turn-on state, and a voltage charged in the capacitor C1-2 of the first charging unit may be provided to a gate of the third NMOS transistor MN3. Therefore, in the case in which the voltage charged in the capacitor C1-2 of the first charging unit is a conduction voltage or more, the third NMOS transistor MN3 may be turned on.

A source of the fourth NMOS transistor MN4 of the low side switching unit 210 may be connected to the ground through the first to third NMOS transistors MN1 to MN3 that are in the turn-on state, and a voltage charged in the capacitor C1-3 of the first charging unit may be provided to a gate of the fourth NMOS transistor MN4. Therefore, in the case in which the voltage charged in the capacitor C1-3 of the first charging unit is a conduction voltage or more, the fourth NMOS transistor MN4 may be turned on.

A source of the fifth NMOS transistor MN5 of the low side switching unit 210 may be connected to the ground through the first to fourth NMOS transistors MN1 to MN4 that are in the turn-on state, and a voltage charged in the capacitor C1-4 of the first charging unit may be provided to a gate of the fifth NMOS transistor MN5. Therefore, in the case in which the voltage charged in the capacitor C1-4 of the first charging unit is a conduction voltage or more, the fifth NMOS transistor MN5 may be turned on.

Here, each of the plurality of capacitors C1-1 to C1-4 of the first charging unit may be charged with a voltage higher than the conduction voltage of the NMOS transistor in advance, that is, when the low side switching unit 210 is in the turn-off state, which will be described with reference to FIG. 10.

As described above, since all of the first to fifth NMOS transistors MN1 to MN5 of the low side switching unit 210 are turned on, the output voltage may become 0V.

Referring to FIG. 8, in the case in which the second control signal SC2 is the high level (10V), when the operating voltage is also 10V, the first PMOS transistor MP1 of the high side switching unit 220 may be turned off.

Therefore, when the first PMOS transistor MP1 is in the turn-off, all of the second to fifth PMOS transistors MP2 to MP5 of the high side switching unit 220 may be turned off.

Figure 9:
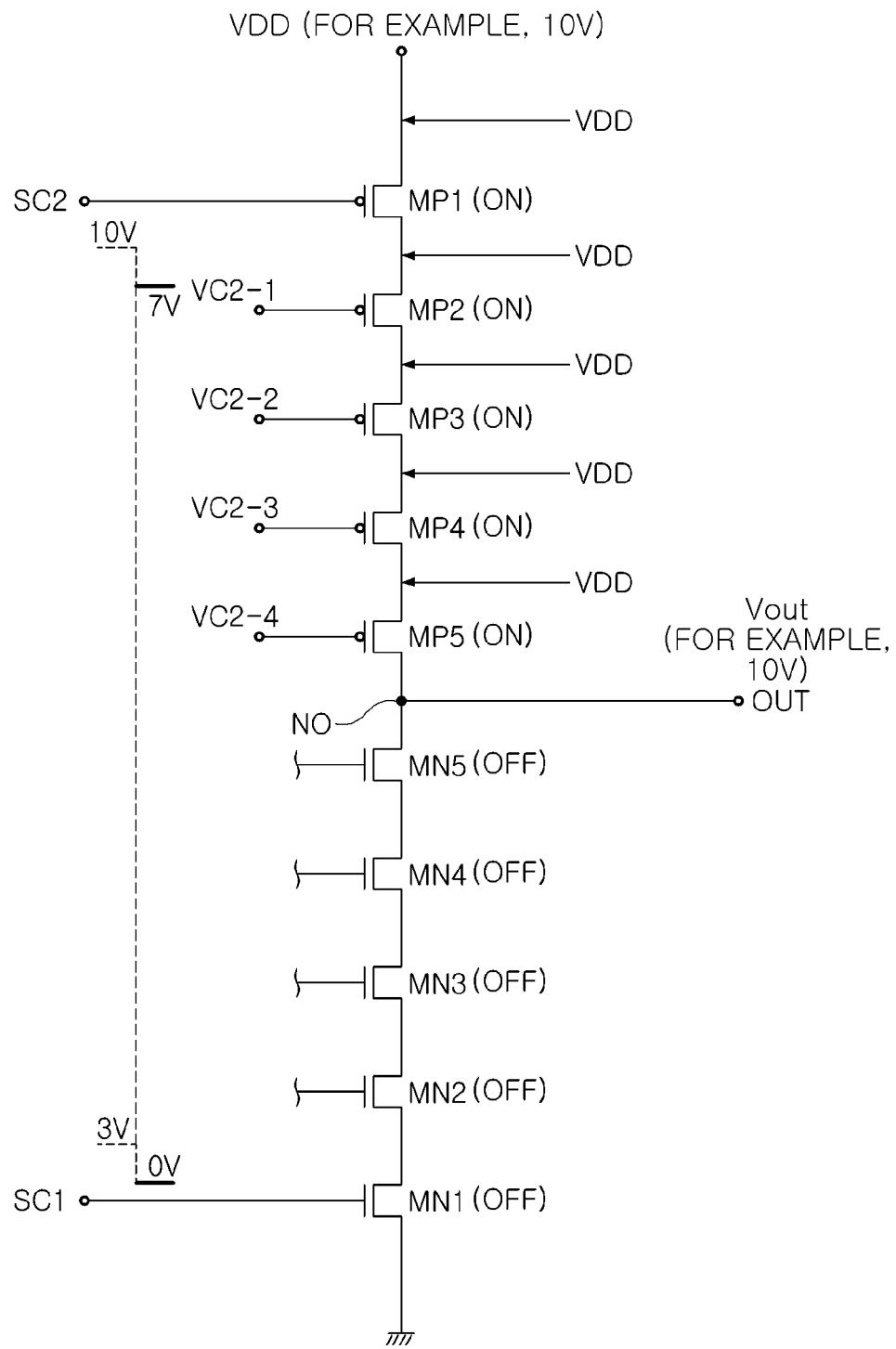
FIG. 9 is a diagram illustrating a second operation of the high voltage driver according to an exemplary embodiment of the present disclosure.

FIG. 9 is a diagram illustrating a second operation of the high voltage driver according to an exemplary embodiment of the present disclosure; FIG. 10 is a diagram illustrating an operation of a high side switching unit of FIG. 6; and FIG. 11 is a diagram illustrating an operation of a low side switching unit of FIG. 6.

First, referring to FIG. 9, when it is assumed that the operating voltage VDD is 10V and the ground is 0V, in the case in which the first control signal SC1 is the low level (0V) and the second control signal SC2 is 7V, all of the first to fifth PMOS transistors MP1 to MP5 of the high side switching unit 220 may be turned on by the second control signal SC2 of 7V, and all of the first to fifth NMOS transistors MN1 to MN5 of the low side switching unit 210 may be turned off by the first control signal SC1 of 0V.

Therefore, the output terminal OUT of the high voltage driver may be connected to the power supply voltage VDD through the high side switching unit 220 that is in the turn-on state, such that the output voltage Vout may become 10V.

Figure 10:
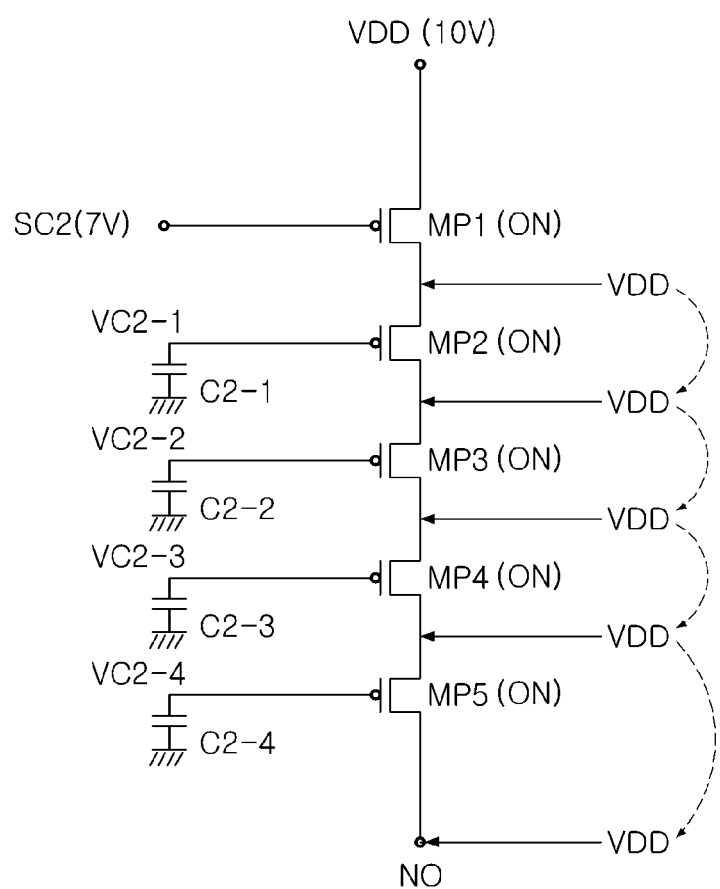
FIG. 10 is a diagram illustrating an operation of a high side switching unit of FIG. 6.
Figure 11:
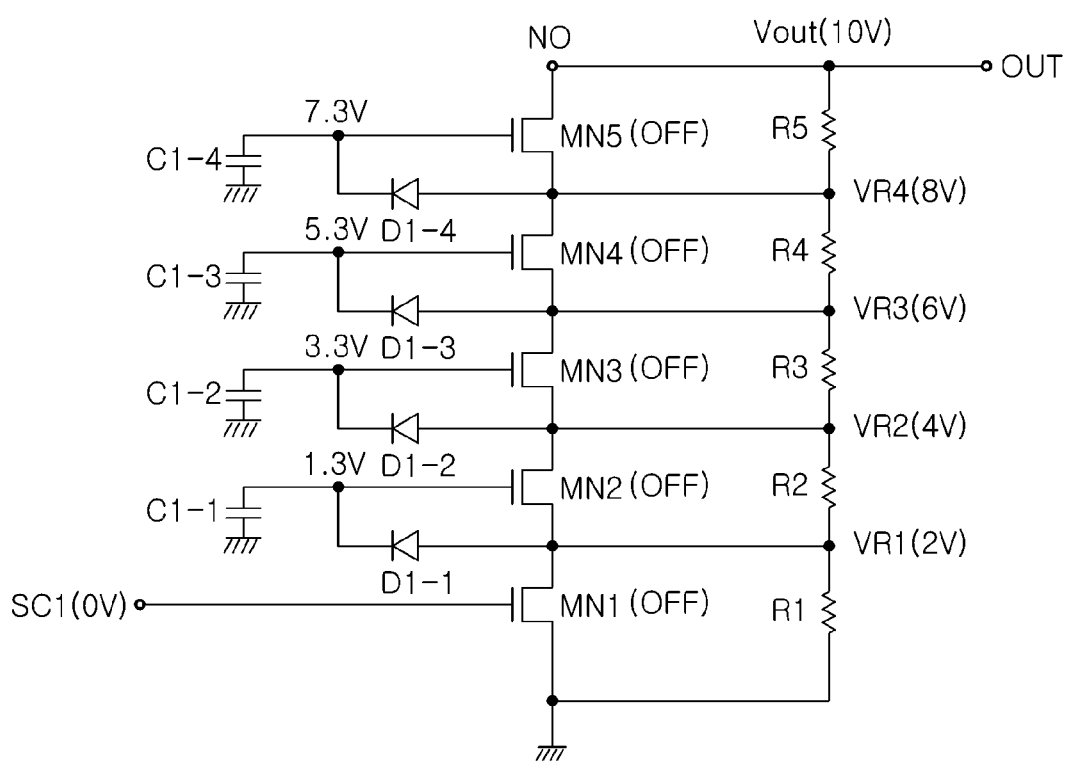
FIG. 11 is a diagram illustrating an operation of a low side switching unit of FIG. 6.

Referring to FIG. 10, when the second control signal SC2 is the low level (7V), in the case the operating voltage is 10V, the first PMOS transistor MP1 of the high side switching unit 220 may be turned on.

A source of the second PMOS transistor MP2 of the high side switching unit 220 may receive the power supply voltage VDD through the first PMOS transistor MP1 that is in the turn-on state, and a voltage charged in the capacitor C2-1 of the second charging unit may be provided to a gate of the second PMOS transistor MP2. Therefore, in the case in which the voltage charged in the capacitor C2-1 of the second charging unit is lower than the power supply voltage VDD by a conduction voltage or more, the second PMOS transistor MP2 may be turned on.

A source of the third PMOS transistor MP3 of the high side switching unit 220 may receive the power supply voltage VDD through the first and second PMOS transistors MP1 and MP2 that are in the turn-on state, and a voltage charged in the capacitor C2-2 of the second charging unit may be provided to a gate of the third PMOS transistor MP3. Therefore, in the case in which the voltage charged in the capacitor C2-2 of the second charging unit is lower than the power supply voltage VDD by a conduction voltage or more, the third PMOS transistor MP3 may be turned on.

A source of the fourth PMOS transistor MP4 of the high side switching unit 220 may receive the power supply voltage VDD through the first to third PMOS transistors MP1 to MP3 that are in the turn-on state, and a voltage charged in the capacitor C2-3 of the second charging unit may be provided to a gate of the fourth PMOS transistor MP4. Therefore, in the case in which the voltage charged in the capacitor C2-3 of the second charging unit is lower than the power supply voltage VDD by a conduction voltage or more, the fourth PMOS transistor MP4 may be turned on.

A source of the fifth PMOS transistor MP5 of the high side switching unit 220 may receive the power supply voltage VDD through the first to fourth PMOS transistors MP1 to MP4 that are in the turn-on state, and a voltage charged in the capacitor C2-4 of the second charging unit may be provided to a gate of the fifth PMOS transistor MP5. Therefore, in the case in which the voltage charged in the capacitor C2-4 of the second charging unit is lower than the power supply voltage VDD by a conduction voltage or more, the fifth PMOS transistor MP5 may be turned on.

Here, each of the plurality of capacitors C2-1 to C2-4 of the second charging unit may be charged with a voltage for conduction of the PMOS transistor in advance, that is, when the high side switching unit 220 is in the turn-off state.

In addition, each of the plurality of capacitors C2-1 to C2-4 of the second charging unit may control each parasitic capacitance and voltage of the first to fourth PMOS transistors MP1 to MP4, such that each gate voltage of the first to fourth PMOS transistors MP1 to MP4 may be lower than a breakdown voltage while being a conductible voltage.

As described above, since all of the first to fifth PMOS transistors MP1 to MP5 of the high side switching unit 220 are turned on, the output voltage may become 10V.

Referring to FIGS. 4 through 10, the output voltage Vout of 10V may be divided into 8V (VR4), 6V (VR3), 4V (VR2), and 2V (VR1) by the first and fifth resistors R1 to R5 of the voltage dividing unit 300, respectively, as described above.

In this case, the voltages divided by the voltage dividing unit 300 may be provided to the connection nodes between the first to fifth PMOS transistors MP1 to MP5 and the connection nodes between the first to fifth NMOS transistors MN1 to MN5, respectively. Here, a voltage between terminals of each of the first to fifth NMOS transistors MN1 to MN5 may become a breakdown voltage or less. For example, a drain voltage of the fifth NMOS transistor MN5 is 10V, a source voltage thereof is 8V, and a gate voltage thereof is 7.3V, such that a voltage between the terminals may become a breakdown voltage or less. Therefore, each of the first to fifth NMOS transistors MN1 to MN5 is not damaged due to a high voltage, but may be protected from the high voltage.

Then, the divided voltages may be provided to and charged in the first charging unit 510 through the diodes D1-1 to D1-4 of the first constant voltage unit 410, and may be provided to and charged in the second charging unit 520 through the diodes D2-1 to D2-4 of the second constant voltage unit 420.

As described above, the voltages charged in the first and second charging units 510 and 520 may be used for operations of the low side switching unit 210 and the high side switching unit 220.

Referring to FIG. 11, in the case in which the first control signal SC1 is the low level (0V), the first NMOS transistor MN1 of the low side switching unit 220 may be turned off.

Therefore, when the first NMOS transistor MN1 is in the turn-off, all of the second to fifth NMOS transistors MN2 to MN5 of the low side switching unit 210 may be turned off.

For example, the output voltage Vout of 10V may be divided into 8V (VR4), 6V (VR3), 4V (VR2), and 2V (VR1) by the first and fifth resistors R1 to R5 of the voltage dividing unit 300, respectively.

8V (VR4), 6V (VR3), 4V (VR2), and 2V (VR1) may be provided to the connection nodes between the first to fifth NMOS transistors MN1 to MN5, respectively, and may be charged in the first charging unit 510 through the first constant voltage unit 410.

In addition, 8V (VR4), 6V (VR3), 4V (VR2), and 2V (VR1) may be provided to the connection nodes between the first to fifth PMOS transistors MP1 to MP5, respectively, and may be charged in the second charging unit 510 through the second constant voltage unit 420.

As set forth above, according to exemplary embodiments of the present disclosure, a high voltage driving signal may be generated using a low voltage transistor, individually grounded charging capacitors, and two control signals, and a high voltage may be driven by a simply circuit using a transistor having a low breakdown voltage. In addition, a delay time of the control signal is significantly decreased, whereby a phenomenon that a transistor is damaged due to a delay error of the control signal may be prevented.

While exemplary embodiments have been shown and described above, it will be apparent to those skilled in the art that modifications and variations could be made without departing from the spirit and scope of the present disclosure as defined by the appended claims.

What is claimed is:

1. A high voltage driver comprising:
    a low side switching unit including first and second to n-th N-channel metal oxide semiconductor (NMOS) transistors connected to each other in series between an output terminal and a ground and operated in a turned-on or turned-off state depending on a first control signal;
    a high side switching unit including first and second to n-th P-channel MOS (PMOS) transistors connected to each other in series between a power supply voltage terminal and the output terminal and operated complementarily to the low side switching unit depending on a second control signal;
    a voltage dividing unit dividing a voltage between the output terminal and the ground and providing the divided voltages to connection nodes between the first and second to n-th PMOS transistors and connection nodes between the first and second to n-th NMOS transistors, respectively;
    a first constant voltage unit providing a constant voltage and a unidirectional signal path between a source and a gate of each of the second to n-th NMOS transistors;
    a second constant voltage unit providing a constant voltage and a unidirectional signal path between a source and a gate of each of the second to n-th PMOS transistors;
    a first charging unit charged with a voltage through the signal path of the first constant voltage unit and providing the charged voltage to each of the gates of the second to n-th NMOS transistors; and a second charging unit charged with a voltage through the signal path of the second constant voltage unit and providing the charged voltage to each of the gates of the second to n-th PMOS transistors.

2. The high voltage driver of claim 1, wherein the first NMOS transistor is operated in the turned-on or turned-off state depending on the first control signal, and
the second to n-th NMOS transistors are operated in synchronization with an operational state of the first NMOS transistor.

3. The high voltage driver of claim 1, wherein the first PMOS transistor is operated in the turned-on or turned-off state depending on the second control signal, and
the second to n-th PMOS transistors are operated in synchronization with an operational state of the first PMOS transistor.

4. The high voltage driver of claim 1, wherein the voltage dividing unit includes first to n-th resistors connected to each other in series between the output terminal and the ground and having the same resistance value in order to uniformly divide the voltage.

5. The high voltage driver of claim 1, wherein the first constant voltage unit includes a plurality of diodes connected between the sources and the gates of the second to n-th NMOS transistors, respectively, in a forward direction.

6. The high voltage driver of claim 1, wherein the second constant voltage unit includes a plurality of diodes connected between the sources and the gates of the second to n-th PMOS transistors, respectively, in a forward direction.

7. The high voltage driver of claim 1, wherein the first charging unit includes a plurality of capacitors connected between the gates of the second to n-th NMOS transistors and the ground, respectively, and providing the charged voltage.

8. The high voltage driver of claim 1, wherein the second charging unit includes a plurality of capacitors connected between the gates of the second to n-th PMOS transistors and the ground, respectively, and providing the charged voltage.

9. A high voltage driver comprising:
a control signal generating unit generating a first control signal having a high level and a low level based on a ground level and a second control signal having an opposite phase to that of the first control signal and having a high level and a low level based on a power supply voltage;
a low side switching unit including first and second to n-th NMOS transistors connected to each other in series between an output terminal and a ground and operated in a turned-on or turned-off state depending on the first control signal;
a high side switching unit including first and second to n-th PMOS transistors connected to each other in series between a power supply voltage terminal and the output terminal and operated in a turn-off or turn-on state depending on the second control signal;
a voltage dividing unit dividing a voltage between the output terminal and the ground and providing the divided voltages to connection nodes between the first and second to n-th PMOS transistors and connection nodes between the first and second to n-th NMOS transistors, respectively;
a second constant voltage unit providing a constant voltage and a unidirectional signal path between a source and a gate of each of the second to n-th PMOS transistors;
a first constant voltage unit providing a constant voltage and a unidirectional signal path between a source and a gate of each of the second to n-th NMOS transistors;

a second charging unit charged with a voltage through the signal path of the second constant voltage unit and providing the charged voltage to each of the gates of the second to n-th PMOS transistors; and
a first charging unit charged with a voltage through the signal path of the first constant voltage unit and providing the charged voltage to each of the gates of the second to n-th NMOS transistors.

10. The high voltage driver of claim 9, wherein the first NMOS transistor is operated in the turned-on or turned-off state depending on the first control signal, and
the second to n-th NMOS transistors are operated in synchronization with an operational state of the first NMOS transistor.

11. The high voltage driver of claim 9, wherein the first PMOS transistor is operated in the turned-on or turned-off state depending on the second control signal, and
the second to n-th PMOS transistors are operated in synchronization with an operational state of the first PMOS transistor.

12. The high voltage driver of claim 9, wherein the voltage dividing unit includes first to n-th resistors connected to each other in series between the output terminal and the ground and having the same resistance value in order to uniformly divide the voltage.

13. The high voltage driver of claim 9, wherein the first constant voltage unit includes a plurality of diodes connected between the sources and the gates of the second to n-th NMOS transistors, respectively, in a forward direction.

14. The high voltage driver of claim 9, wherein the second constant voltage unit includes a plurality of diodes connected between the sources and the gates of the second to n-th PMOS transistors, respectively, in a forward direction.

15. The high voltage driver of claim 9, wherein the first charging unit includes a plurality of capacitors connected between the gates of the second to n-th NMOS transistors and the ground, respectively, and providing the charged voltage.

16. The high voltage driver of claim 9, wherein the second charging unit includes a plurality of capacitors connected between the gates of the second to n-th PMOS transistors and the ground, respectively, and providing the charged voltage.

17. A high voltage driver comprising:
a control signal generating unit generating a first control signal having a high level and a low level based on a ground level and a second control signal having an opposite phase to that of the first control signal and having a high level and a low level based on a power supply voltage;
a low side switching unit including first and second to n-th NMOS transistors connected to each other in series between an output terminal and a ground and operated in a turned-on or turned-off state depending on the first control signal;
a high side switching unit including first and second to n-th PMOS transistors connected to each other in series between a power supply voltage terminal and the output terminal and operated in a turn-off or turn-on state depending on the second control signal;
a voltage dividing unit dividing a voltage between the output terminal and the ground and providing the divided voltages to connection nodes between the first and second to n-th PMOS transistors and connection nodes between the first and second to n-th NMOS transistors, respectively;
a second constant voltage unit providing a constant voltage and a unidirectional signal path between a source and a gate of each of the second to n-th PMOS transistors;

a first constant voltage unit providing a constant voltage and a unidirectional signal path between a source and a gate of each of the second to n-th NMOS transistors;

a second charging unit charged with a voltage through the signal path of the second constant voltage unit and providing the charged voltage to each of the gates of the second to n-th PMOS transistors;

a first charging unit charged with a voltage through the signal path of the first constant voltage unit and providing the charged voltage to each of the gates of the second to n-th NMOS transistors; and a signal synchronizing unit connected between terminals of the control signal generating unit outputting the first and second control signal.

18. The high voltage driver of claim 17, wherein the first NMOS transistor is operated in the turned-on or turned-off state depending on the first control signal, and the second to n-th NMOS transistors are operated in synchronization with an operational state of the first NMOS transistor, and the first PMOS transistor is operated in the turned-on or turned-off state depending on the second control signal, and the second to n-th PMOS transistors are operated in synchronization with an operational state of the first PMOS transistor.

19. The high voltage driver of claim 17, wherein the first constant voltage unit includes a plurality of diodes connected between the sources and the gates of the second to n-th NMOS transistors, respectively, in a forward direction, and the second constant voltage unit includes a plurality of diodes connected between the sources and the gates of the second to n-th PMOS transistors, respectively, in a forward direction.

20. The high voltage driver of claim 17, wherein the first charging unit includes a plurality of capacitors connected between the gates of the second to n-th NMOS transistors and the ground, respectively, and providing the charged voltage, and the second charging unit includes a plurality of capacitors connected between the gates of the second to n-th PMOS transistors and the ground, respectively, and providing the charged voltage.

* * * * *